United States Patent
Zielinski et al.

(10) Patent No.: US 9,130,525 B2
(45) Date of Patent: Sep. 8, 2015

(54) SYSTEMS AND METHODS FOR ALTERING DISPLAY OUTPUT BASED ON SEAT POSITION

(71) Applicant: Toyota Motor Engineering & Manufacturing North America, Inc., Erlanger, KY (US)

(72) Inventors: Eric John Zielinski, Plymouth, MI (US); Christopher Lee Rovik, Canton, MI (US); Kristen Andrea Tabar, Canton, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 291 days.

(21) Appl. No.: 13/779,922

(22) Filed: Feb. 28, 2013

(65) Prior Publication Data

US 2014/0241534 A1  Aug. 28, 2014

(51) Int. Cl.
*H03G 3/20* (2006.01)
*H04R 29/00* (2006.01)
*H03G 5/16* (2006.01)
*H03G 5/00* (2006.01)

(52) U.S. Cl.
CPC .............. *H03G 5/165* (2013.01); *H03G 5/005* (2013.01)

(58) Field of Classification Search
USPC ............ 381/57, 56, 58, 86; 345/660; 359/462
See application file for complete search history.

(56) References Cited

U.S. PATENT DOCUMENTS

| | | | |
|---|---|---|---|
| 5,581,621 A | 12/1996 | Koyama et al. | |
| 6,154,666 A | 11/2000 | Patterson et al. | |
| 7,023,617 B2 * | 4/2006 | Tamaki et al. | 359/462 |
| 7,680,286 B2 | 3/2010 | Hashimoto et al. | |
| 8,189,825 B2 | 5/2012 | Breed | |
| 2002/0067366 A1 * | 6/2002 | Hirao et al. | 345/660 |
| 2011/0064232 A1 | 3/2011 | Ruwisch | |
| 2012/0308036 A1 | 12/2012 | Christoph | |

OTHER PUBLICATIONS

Fujitsu Ten Tech No. 8, Kowaki, et al, "Characteristics Tuning System for Automobile Audio System Components" 1996, 10 pages.

* cited by examiner

*Primary Examiner* — Thjuan K Addy
(74) *Attorney, Agent, or Firm* — Dinsmore & Shohl LLP

(57) ABSTRACT

Systems and methods for altering display output based on seat position include a method includes receiving desired frequency response data for a plurality of different audio outputs and a nominal seat position, determining a current seat position of a seat in the vehicle, and implementing a test sequence based on the seat position. Some embodiments include determining from the test sequence received frequency response data for the amplifier to utilize for the seat position, comparing the received frequency response data and the desired frequency response data, and in response to determining that the desired frequency response data does not substantially match the received frequency response data, altering settings on the amplifier such that the received frequency response data substantially matches the desired frequency response data.

20 Claims, 4 Drawing Sheets

SYSTEMS AND METHODS FOR ALTERING DISPLAY OUTPUT BASED ON SEAT POSITION

TECHNICAL FIELD

Embodiments described herein generally relate to systems and methods for altering display output based on seat position and, more specifically, to vehicle-based systems and methods that determine a seat position to provide a consistent viewing experience in a vehicle.

BACKGROUND

It is generally desired to create a vehicle audio environment that is consistent across mass produced vehicles, across music types, and within various areas of each vehicle. Accordingly, current vehicle designs include tuning options based on music type, with fade and balance controls that allow the driver to manually change the audio output. However, if a driver's or passenger's seat position changes, the tuning must be altered to provide the same listening and viewing experience at those new positions.

Accordingly, a need exists for enhanced vehicle viewing and listening environments that provide a consistent audio and/or video viewing experience, regardless of location.

SUMMARY

Systems and methods for altering display output based on seat position are described. One embodiment of a method includes receiving desired frequency response data for a plurality of different audio outputs and a nominal seat position, determining a current seat position of a seat in the vehicle, and implementing a test sequence based on the seat position. Some embodiments include determining from the test sequence received frequency response data for the amplifier to utilize for the seat position, comparing the received frequency response data and the desired frequency response data, and in response to determining that the desired frequency response data does not substantially match the received frequency response data, altering settings on the amplifier such that the received frequency response data substantially matches the desired frequency response data.

In another embodiment, a system for altering display output based on seat position includes a seat sensor for detecting a position of a seat in the vehicle, a display device for providing an output signal for receipt by a user, a display sensor for receiving output from the display device, and a vehicle computing device. The vehicle computing device may store logic that, when executed by a processor, causes the vehicle computing device to receive desired frequency response data for a plurality of different outputs and a corresponding nominal seat position, determine, from the seat sensor, a current seat position of a seat in the vehicle, and implement a test sequence based on the seat position. In some embodiments, the logic further causes the processor to determine from the test sequence received frequency response data to utilize for the seat position, compare the received frequency response data and the desired frequency response data and in response to determining that the desired frequency response data does not substantially match the received frequency response data, alter a setting such that the received frequency response data substantially matches the desired frequency response data.

In yet another embodiment, a vehicle computing device includes a memory component that stores logic that, when executed by a processor, causes the vehicle computing device to receive desired frequency response data for a plurality of different display device outputs and a corresponding nominal seat position, determine a current seat position of a seat in the vehicle, implement a test sequence based on the seat position, and determine from the test sequence received frequency response data to utilize for the seat position. In some embodiments, the logic further causes the processor to compare the received frequency response data and the desired frequency response data, in response to determining that the desired frequency response data substantially matches the received frequency response data, implementing amplifier settings according to the nominal seat position; and in response to determining that the desired frequency response data does not substantially match the received frequency response data, alter a setting such that the received frequency response data substantially matches the desired frequency response data.

These and additional features provided by the embodiments of the present disclosure will be more fully understood in view of the following detailed description, in conjunction with the drawings.

BRIEF DESCRIPTION OF THE DRAWINGS

The embodiments set forth in the drawings are illustrative and exemplary in nature and not intended to limit the disclosure. The following detailed description of the illustrative embodiments can be understood when read in conjunction with the following drawings, where like structure is indicated with like reference numerals and in which.

DETAILED DESCRIPTION

Embodiments disclosed herein include systems and methods for altering display output based on seat position. Some embodiments are configured with an audio and/or video display system that may be adjusted based on a test mode that utilizes a microphone in the headrest of the seat. Once the seat position is changed, if the test signal is played again, the microphone receives the test signal and sends the signal to the amplifier. The amplifier (and/or vehicle computing device) may adjust the entire vehicle equalization accordingly to substantially match the intended tuning. Embodiments may also correct any threshold, variance, and/or other variables that are present in the entire audio system tolerance, since the amplifier will adjust to the normal tuning.

To implement, the amplifier may be initially tuned for the vehicle cabin at a nominal seat position (or plurality of nominal seat positions) during vehicle development. Once the vehicle is tuned based on this nominal seat position, the frequency response curve for the vehicle may be stored. Once in a vehicle, regardless of seat position or part tolerance, when the test mode is run, the amplifier will receive the new frequency response curve that will be used to automatically adjust the output to the speakers to substantially match the intended frequency response.

While some embodiments may include the speaker installed in the cabin of the vehicle, some may be configured such that the microphone is simply used during manufacturing. Specifically, a test track could be played and the microphone would register the vehicle frequency response. The measured frequency response may be sent to the amplifier and the amplifier may adjust the output to the speakers to substantially match the frequency response stored during tuning. This would take into account the variation in vehicle interior and part tolerance and produce the sound exactly as intended. The microphone may be removed after these parameters are set.

Additionally, some embodiments may be configured to customize the visual experience of a vehicle. As with the audio tuning, dashboard lights, navigation systems, and/or other light sources of a vehicle may produce a visible output. As the seat position changes, the light received by the driver (or passenger) may change. Accordingly, frequency response data of a visual spectrum of light may be determined for a nominal seat position. As the seat position and/or other predetermined factors are changed (and a test sequence is performed), output controls of the light sources may be altered to substantially match the desired frequency response data.

Figure 1:
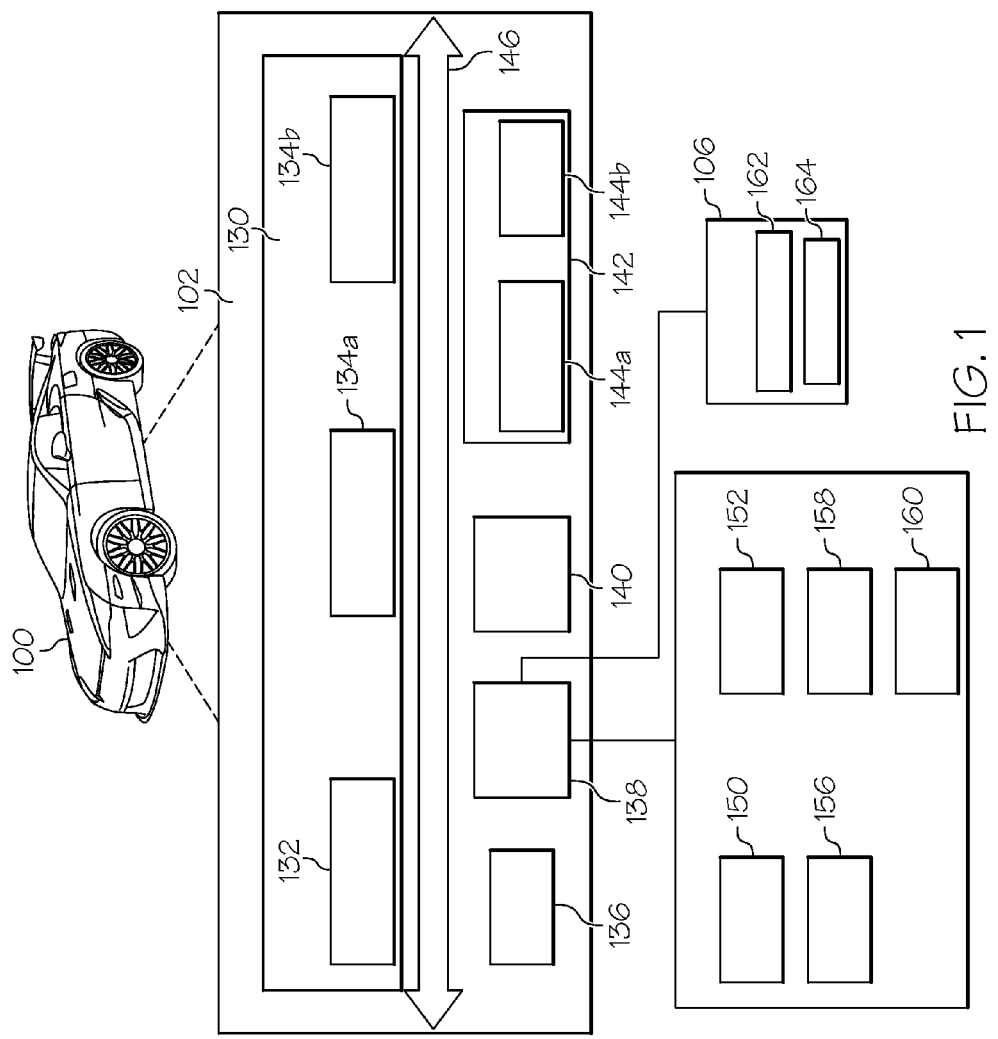
FIG. 1 schematically depicts a vehicle that includes a vehicle computing device and an audio/video display system, according to embodiments disclosed herein.

Referring now to the drawings, FIG. 1 schematically depicts a vehicle 100 that includes a vehicle computing device 102 and an audio/video display system 104, according to embodiments disclosed herein. The vehicle 100 is depicted in FIG. 1 as an automobile, but may be any passenger or non-passenger vehicle such as, for example, a terrestrial, aquatic, and/or airborne vehicle. The vehicle 100 may include or be coupled to an audio/video display system 104 and/or other system for providing audio, video, and/or image content, as well as vehicle hardware 106 for providing seat controls 162 and seat sensors 164.

Also illustrated in the vehicle computing device 102 are a memory component 130, a processor 136, input/output hardware 138, network interface hardware 140, and a data storage component 142 (which stores frequency response data 144a, position data 144b, and/or other data), and the memory component 130. The memory component 130 may be configured as volatile and/or nonvolatile memory and as such, may include random access memory (including SRAM, DRAM, and/or other types of RAM), flash memory, secure digital (SD) memory, registers, compact discs (CD), digital versatile discs (DVD), and/or other types of non-transitory computer-readable mediums. Depending on the particular embodiment, these non-transitory computer-readable mediums may reside within the vehicle computing device 102 and/or external to the vehicle computing device 102.

The memory component 130 may store operating logic 132, test logic 134a and the display logic 134b. The test logic 134a and the display logic 134b may each include a plurality of different pieces of logic, each of which may be embodied as a computer program, firmware, and/or hardware, as an example. A communications path 146 is also included in FIG. 1 and may be implemented as a bus or other communication interface to facilitate communication among the components of the vehicle computing device 102.

The processor 136 may include any processing component operable to receive and execute instructions (such as from a data storage component 142 and/or the memory component 130). As described above, the input/output hardware 138 may include and/or be configured to interface with external components, such as the audio/video display system 104 and/or vehicle hardware 106. The audio/video display system 104 may include display devices 150, a display sensor 152, an amplifier 156, an equalizer 158, and/or input components 160. As described in more detail below, the display devices 150 may include one or more audio display devices, such as speakers and/or one or more visual display devices, such as video monitors, in-dash touch screen control interfaces, and/or other similar devices for providing still and/or motion imagery and data. The display sensor 152 may include one or more audio sensors for detecting audio frequency response across a spectrum of audio frequencies. The display sensor 152 may additionally include one or more visual sensors for detecting visual frequency response data over a spectrum of light frequencies. The amplifier 156 may include one or more audio amplifiers for providing audio to the vehicle 100. The amplifier 156 may be configured according to a desired audio output and a tested audio output, as described in more detail below. The equalizer 158 may include one or more equalizers for further configuring the audio output of the audio/video display system 104. The input components 160 may include one or more input components, such as channel controls, volume controls, mode controls, etc. for controlling the audio/video display system 104.

The vehicle hardware 106 may additionally be coupled to the input/output hardware 138 and may include seat controls 162 and seat sensors 164. As described in more detail below, the seat controls 162 may be utilized to set a current seat position. Similarly, the seat sensors 164 may be utilized for determining the current seat position and/or sending data related to the current seat position to the vehicle computing device 102.

The network interface hardware 140 may include and/or be configured for communicating with any wired or wireless networking hardware, including an antenna, a modem, a LAN port, wireless fidelity (Wi-Fi) card, WiMax card, mobile communications hardware, and/or other hardware for communicating with other networks and/or devices. From this connection, communication may be facilitated between the vehicle computing device 102 and other computing devices. Accordingly, while the audio/video display system 104 and the vehicle hardware 106 are each depicted in FIG. 1 as being coupled to the vehicle computing device 102 via the input/output hardware 138, this is merely an example. Specifically, some embodiments are configured such that one or more components of the audio/video display system 104 may operate via a wired or wireless connection with the network interface hardware 140.

The operating logic 132 may include an operating system and/or other software for managing components of the vehicle computing device 102. As discussed above, the test logic 134a may reside in the memory component 130 and may be configured to cause the processor 136 to perform one or more audio and/or visual tests on outputs from the audio/video display system 104. Similarly, the display logic 134b may be utilized to alter the audio and/or visual display of the display devices 150, based on the results determined via the test logic 134a.

It should be understood that while the components in FIG. 1 are illustrated as residing within and/or connected to the vehicle computing device 102 and audio/video display system 104, this is merely an example. In some embodiments, one or more of the components may reside external to the vehicle computing device 102 and/or audio/video display system 104. It should also be understood that, while the vehicle computing device 102 and the audio/video display system 104 are each illustrated as a single device, this is also merely an example. In some embodiments, the components depicted therein may reside on different computing devices.

Additionally, while the vehicle computing device 102 is illustrated with the test logic 134a and the display logic 134b as separate logical components, this is also an example. In some embodiments, a single piece of logic may cause the vehicle computing device 102 to provide the described functionality.

Figure 2:
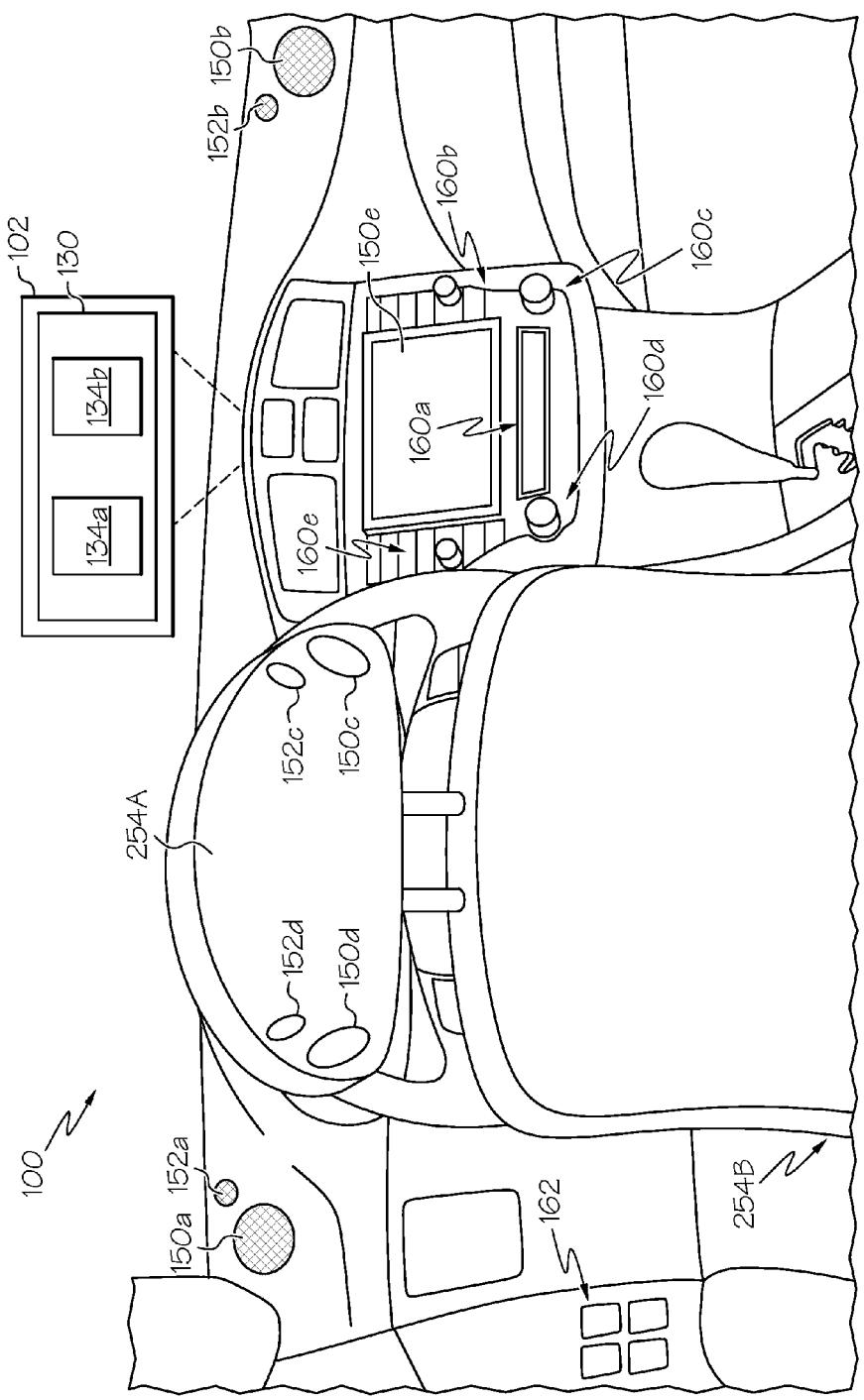
FIG. 2 schematically depicts an interior of a vehicle for providing enhanced audio and/or video output, according to embodiments disclosed herein.

FIG. 2 schematically depicts an interior of the vehicle 100 for providing enhanced audio and/or video output, according to embodiments disclosed herein. As illustrated, the vehicle 100 includes the vehicle computing device 102 with the memory component 130 that stores the test logic 134a and the display logic 134b. Also included are the display devices 150a, 150b, 150c, and 150d, which are depicted in FIG. 2 as speakers. The display devices 150 may be located in the positions depicted in FIG. 2 and/or elsewhere throughout the vehicle 100 for the benefit of the driver and/or passengers of the vehicle 100. As an example, in some embodiments the display devices 150c and 150d may be located on a headrest 254a of a seat 254b. Similarly, the vehicle 100 includes visual display device 150e, which may be configured as a user interface for audio, video, navigation, etc. Other visual display devices and/or light sources may also be provided within the vehicle 100 for the driver and/or passengers.

The vehicle 100 additionally includes the display sensors 152. Specifically, display sensors 152a, 152b, 152c, and 152d may be configured as audio and/or visual sensors for determining the audio and/or visual output received from the display devices 150 at various positions within or around the vehicle 100. The input components 160 may include a disc receiving portion 160a, a volume control 160b, a channel control 160c, a mode select control 106d, and a test control 106e.

Also included in FIG. 2 is the seat control 162. The seat control 162 may be configured to provide the driver or passenger with the ability to determine the exact position of the headrest 254a and/or the seat 254b. The seat position control 252 may include options to adjust the position of the seat 254, such as seat height, set recline, lumbar support, lateral position, etc.

By utilizing the components depicted in FIGS. 1 and 2, some embodiments may be configured to adjust the amplifier 156 to desired audio frequency response data that is based on a nominal seat position. This may be determined from a first test sequence. That includes providing a predetermined sequence of sounds or visual displays on via the display devices 150. Based on the audio and/or visual data received from the display sensors 152, the vehicle computing device 102 (and/or amplifier 156) may determine the desired frequency response data for the nominal seat position.

Thus, when a driver or passenger enters the vehicle 100 and adjusts the seat 254b, a determination may be made regarding the received audio frequency response data that the driver or passenger is receiving at the new seat position. This may be accomplished via a second test sequence or other audio output where the display sensors 152 may detect the frequency response that is received by the driver or passenger. The second test sequence may include providing a similar predetermined sequence of sounds or visual displays on via the display devices 150. Based on the audio and/or visual data received from the display sensors 152, the vehicle computing device 102 (and/or amplifier 156) may determine the received frequency response data for the current seat position. A comparison of the received frequency response data may then be made with the desired frequency response data. If the comparison indicates that the received frequency response data is different than the desired frequency response data, amplifier settings may be adjusted to provide the desired frequency response for that seat position. If the desired frequency response matches or substantially matches the received frequency response data, the amplifier settings for the nominal seat position may be utilized. Depending on the particular embodiment, the settings on the amplifier 156 and the seat position may be stored, such that the amplifier 156 may be automatically adjusted if the seat is again configured in this position.

It should be understood that other vehicle settings and/or environmental factors may be taken into account when determining the desired frequency response data. As an example, colder air may alter the transmission of sound signals, thus causing the driver to receive different frequency response data with the same amplifier settings than if the air is warmer. Similarly, humid air may provide a different frequency response to the user (driver or passenger) than dry air. For light signals, ambient light may have different effects on the received frequency response data. Accordingly, when the amplifier 156 is originally adjusted to the desired frequency response, humidity, temperature, and other conditions may be determined and adjusted to nominal levels. Similarly, when the received frequency response data is determined, the environmental factor may also be determined and utilized for proper adjustment of the amplifier 156. Thus, if the environmental factor changes, the amplifier 156 may be automatically adjusted to account to the changing conditions.

As another example, some embodiments may be configured for determining visual output at different seat positions and with different environmental conditions. Depending on the seat position, the time of day, the time of year, cloud cover, various visual outputs from light sources, such as the visual display device, interior lights of the vehicle 100, etc. may vary in color and intensity when received by the driver (or passenger). Accordingly, the display sensors 152 may be configured to receive visible light and facilitate a determination of the intensity and frequency response or color spectrum at different seat positions and in different environmental conditions.

Accordingly, when the vehicle 100 is in production, a nominal seat position and nominal environmental factors may be utilized. Additionally, predetermined light signals may be provided and the light signals may be sensed by the display sensors 152. This may be stored with the vehicle computing device 102 to provide desired visual frequency response data. Additionally, if the seat position and/or the environmental conditions change, a test sequence may be run to determine if the received visual frequency response data that is received by the driver or passenger has changed from the visual response of the nominal seat position. If so, the vehicle computing device 102 may facilitate alteration of the output of one or more of the light sources in the vehicle 100 to provide a consistent visual output that is received by the driver and/or passenger. If the received visual response is the same as the desired frequency response data, the output settings of the light sources for the nominal seat position may be utilized.

Figure 3A:
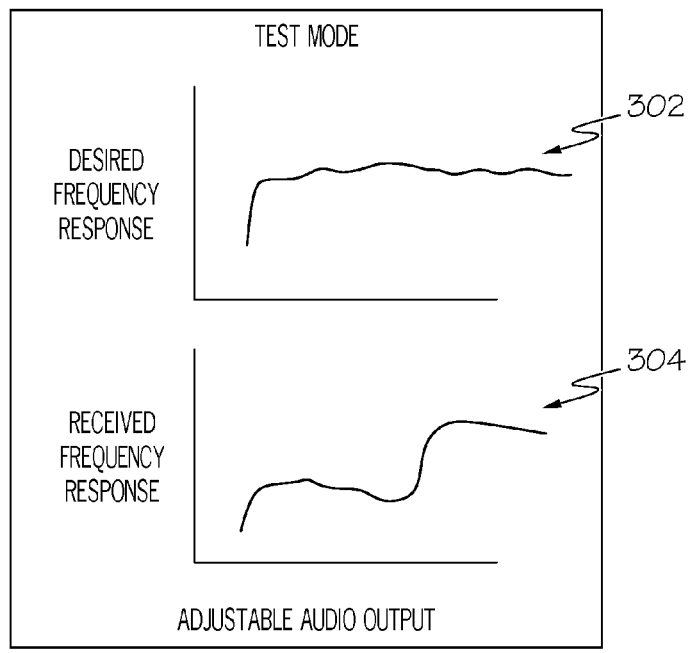
FIG. 3A schematically depicts test mode results for providing an adjustable audio output, according to embodiments disclosed herein.

FIG. 3A schematically depicts test mode results for providing an adjustable audio output, according to embodiments disclosed herein. As discussed above, desired frequency response data may be determined at a nominal seat position in the vehicle 100. Additionally, the vehicle computing device 102 may be configured to facilitate initiation of a test sequence to determine the desired amplifier settings that will provide the desired frequency response data at the new seat position. Accordingly, FIG. 3A represents a visual depiction of the data that may be analyzed. This data may or may not be provided to a driver, passenger, or tester. Regardless, the desired frequency response data is graphically depicted in curve 302. The received frequency response data is graphically depicted in curve 304. As is evident, the curve 302 representing the desired frequency response data does not substantially match the curve 304 representing the received frequency response curve. Accordingly, the vehicle computing device 102 may adjust the amplifier settings (such as gain, crossover, filters, mode, slope, phase, equalizer, etc.) until the curves 302 and 304 substantially match. Once this is obtained, the current seat position, the amplifier settings, and/or the environmental factors may be stored for future use. Thus, if the same seat position and environmental factors are again realized, the vehicle computing device 102 may automatically adjust the amplifier settings to provide the desired frequency response.

Figure 3B:
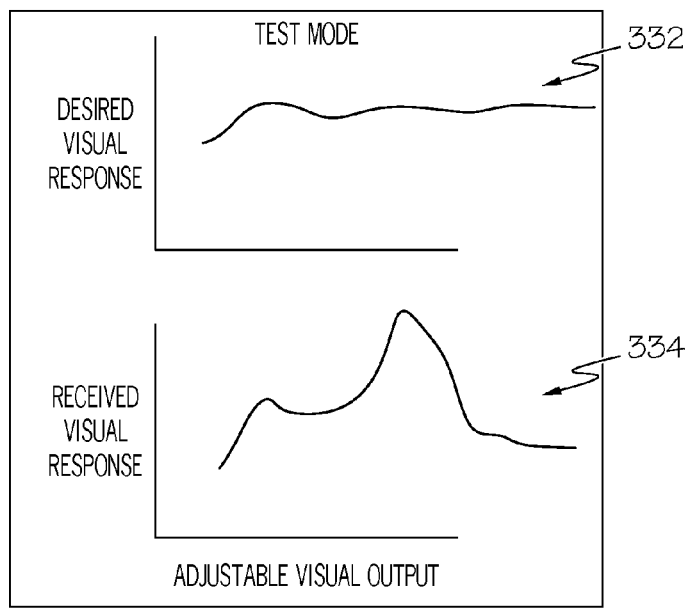
FIG. 3B schematically depicts test mode results for providing an adjustable visual output, according to embodiments disclosed herein.

FIG. 3B schematically depicts test mode data for providing an adjustable visual output, according to embodiments disclosed herein. As described above, the various light sources in the vehicle 100 may provide certain visual frequency response data, both in terms of spectrum and intensity, which is depicted with curve 332. Accordingly, when the vehicle 100 is in production, the desired visual response data may be determined for a nominal seat position and/or nominal environmental factors. Additionally, the vehicle computing device 102 may be configured to provide a test option for the user (driver, passenger, and/or manufacturer) to again test the visual frequency response data at a new seat position and/or with new environmental factors (depicted as curve 334). If the desired visual response data does not substantially match the received visual response data, the light sources may be adjusted to provide the desired visual response. If the desired frequency response data does substantially match the received frequency response data, the light source output settings for the nominal seat position may be utilized.

It should be understood that while in some embodiments, a driver and/or passenger may initiate the test sequence, some embodiments are configured to run the test sequences during production. Accordingly, these embodiments may be configured such that the display sensors 152 may be removable from the vehicle 100 after production (or configuration) is complete. In these embodiments, the vehicle 100 may already store a plurality of different settings for the amplifier and/or light sources based on the desired frequency response.

Figure 4:
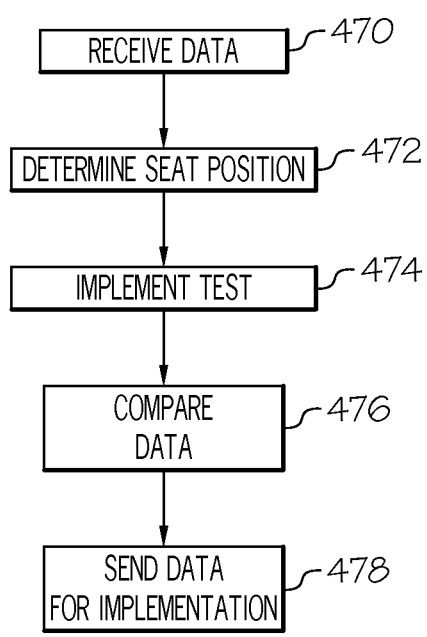
FIG. 4 depicts a flowchart for altering the output of an audio and/or video display system, according to embodiments disclosed herein.

FIG. 4 depicts a flowchart for altering the output of an audio and/or video display system, according to embodiments disclosed herein. As illustrated in block 470, desired frequency response data may be received for a plurality of different audio outputs. In block 472, a seat position of a seat in the vehicle 100 may be determined. In block 474, a test sequence based on the seat position may be implemented to determine a received frequency response. In block 476, a desired frequency response may be compared to the received frequency response to determine if an adjustment is desired. In block 478, data may be sent for adjusting display device settings to implement the desired frequency response.

As illustrated above, various embodiments for altering display device output based on a seat position are disclosed. Accordingly, embodiments described herein may be configured for providing a consistent audio and/or visual experience in a vehicle, regardless of seat position and/or environmental factors.

While particular embodiments and aspects of the present disclosure have been illustrated and described herein, various other changes and modifications can be made without departing from the spirit and scope of the disclosure. Moreover, although various aspects have been described herein, such aspects need not be utilized in combination. Accordingly, it is therefore intended that the appended claims cover all such changes and modifications that are within the scope of the embodiments shown and described herein.

It should now be understood that embodiments disclosed herein includes systems, methods, and non-transitory computer-readable mediums for providing the described functionality. It should also be understood that these embodiments are merely exemplary and are not intended to limit the scope of this disclosure.

What is claimed is:

1. A method for altering display output based on seat position comprising:
   receiving desired frequency response data for a plurality of different audio outputs and a nominal seat position;
   determining a current seat position of a seat in the vehicle;
   implementing a test sequence based on the current seat position;
   determining, from the test sequence, received frequency response data for an amplifier to utilize for the current seat position;
   comparing the received frequency response data and the desired frequency response data; and
   in response to determining that the desired frequency response data does not substantially match the received frequency response data, altering amplifier settings such that the received frequency response data substantially matches the desired frequency response data.

2. The method of claim 1, wherein the test sequence further comprises determining an environmental factor of the vehicle.

3. The method of claim 2, wherein the environmental factor comprises at least one of the following: temperature, humidity, time of day, and time of year.

4. The method of claim 1, further comprising storing the amplifier settings and the current seat position.

5. The method of claim 4, further comprising:
   determining whether the current seat position is the same as the nominal seat position; and
   in response to determining that the current seat position is the same as the nominal seat position, utilizing the amplifier settings for the nominal seat position.

6. The method of claim 1, further comprising:
   determining desired visual response data and received visual response data;
   comparing the desired visual response data with the received visual response data to determine whether the desired visual response data substantially matches the received visual response data; and
   in response to determining that the desired visual response data does not substantially match the received visual response data, altering output of a light source such that the received visual frequency response data substantially matches the desired visual response data.

7. The method of claim 1, wherein the test sequence is initiated by at least one of the following: a driver, a passenger, and a manufacturer.

8. A system for altering display output based on seat position comprising:
   a seat sensor for detecting the seat position of a seat in a vehicle;
   a display device for providing an output signal for receipt by a user;
   a display sensor for receiving output from the display device; and
   a vehicle computing device that stores logic that, when executed by a processor, causes the vehicle computing device to perform at least the following:

receive desired frequency response data for a plurality of different outputs and a corresponding nominal seat position;

determine, from the seat sensor, a current seat position of the seat in the vehicle;

implement a test sequence based on the current seat position;

determine, from the test sequence, received frequency response data to utilize for the current seat position;

compare the received frequency response data and the desired frequency response data; and in response to determining that the desired frequency response data does not substantially match the received frequency response data, alter a setting such that the received frequency response data substantially matches the desired frequency response data.

9. The system of claim 8, wherein the test sequence further comprises determining an environmental factor of the vehicle.

10. The system of claim 9, wherein the environmental factor comprises at least one of the following: temperature, humidity, time of day, and time of year.

11. The system of claim 8, further comprising an amplifier, wherein the amplifier receives audio frequency response data related to the desired frequency response data and adjusts the setting to achieve the frequency response data.

12. The system of claim 8, wherein the desired frequency response data includes desired audio frequency response data and wherein the received frequency response data includes received audio frequency response data.

13. The system of claim 8, wherein the desired frequency response data includes desired visual frequency response data and wherein the received frequency response data includes received visual frequency response data.

14. The system of claim 8, wherein the test sequence is initiated by at least one of the following: a driver, a passenger, and a manufacturer.

15. A vehicle computing device for altering display output based on seat position comprising:

a memory component that stores logic that, when executed by a processor, causes the vehicle computing device to perform at least the following:

receive desired frequency response data for a plurality of different display device outputs and a corresponding a nominal seat position;

determine a current seat position of a seat in a vehicle;

implement a test sequence based on the current seat position;

determine, from the test sequence, received frequency response data to utilize for the current seat position;

compare the received frequency response data and the desired frequency response data;

in response to determining that the desired frequency response data substantially matches the received frequency response data, implementing amplifier settings according to the nominal seat position; and in response to determining that the desired frequency response data does not substantially match the received frequency response data, alter a setting such that the received frequency response data substantially matches the desired frequency response data.

16. The vehicle computing device of claim 15, wherein the test sequence further comprises determining an environmental factor of the vehicle.

17. The vehicle computing device of claim 16, wherein environmental factor comprises at least one of the following: temperature, humidity, time of day, and time of year.

18. The vehicle computing device of claim 15, wherein the logic further causes the vehicle computing device to store the amplifier settings and the current seat position.

19. The vehicle computing device of claim 15, wherein the desired frequency response data includes desired audio frequency response data and wherein the received frequency response data includes received audio frequency response data.

20. The vehicle computing device of claim 15, wherein the desired frequency response data includes desired audio frequency response data and wherein the received frequency response data includes received audio frequency response data.

* * * * *